United States Patent
Baumann et al.

[11] Patent Number: 6,100,707
[45] Date of Patent: Aug. 8, 2000

[54] APPARATUS FOR TESTING MULTI-TERMINAL ELECTRONIC COMPONENTS

[75] Inventors: Josef Baumann, Phoenix; Jakob Herrmann, Chandler, both of Ariz.

[73] Assignee: Electro Scientific Industries, Inc., Portland, Oreg.

[21] Appl. No.: 09/160,801

[22] Filed: Sep. 25, 1998

[51] Int. Cl.⁷ .......................... G01R 1/073; G01R 31/02
[52] U.S. Cl. ..................... 324/761; 324/158.1; 29/592.1
[58] Field of Search .................... 324/761, 762, 324/73.1, 158.1; 209/573, 574; 29/825, 592.1

[56] References Cited

U.S. PATENT DOCUMENTS

| | | | |
|---|---|---|---|
| 3,537,580 | 11/1970 | Beroset et al. | 209/573 |
| 4,115,735 | 9/1978 | Stanford | 324/754 |
| 4,232,928 | 11/1980 | Wickersham | 324/761 |
| 4,749,945 | 6/1988 | Bonifert et al. | 324/761 |
| 4,818,382 | 4/1989 | Anderson et al. | 324/158.1 |
| 5,568,870 | 10/1996 | Utech | 209/573 |

*Primary Examiner*—Ernest Karlsen
*Attorney, Agent, or Firm*—John J. Murphey

[57] ABSTRACT

To facilitate the testing of small electronic components, an improved test probe and transport wheel assembly are disclosed. The basic form of the probe features a fixed support body onto which a movable base is secured by at least one resilient structure. Secured to the movable base are a number of leads that may be moved through complementary tunnels in a fixed guide block toward the side-located terminals of an electronic component to be tested. The transport wheel assembly includes a wheel that has a number of peripherally-located compartments for receiving the electronic components. Each of the compartments includes a metal base. Also disclosed is a metal roller that is designed to press on an end of a component during testing. The metal base of each compartment and the metal roller facilitate electrical connection to the component's end-located terminals by side-located leads from the test probe.

22 Claims, 7 Drawing Sheets

APPARATUS FOR TESTING MULTI-TERMINAL ELECTRONIC COMPONENTS

FIELD OF THE INVENTION

The invention is in the field of testing equipment. More particularly, the invention comprises apparatus designed to facilitate the testing of small electronic components. A unique transport wheel and presser apparatus are taught for use in a machine designed for testing electronic components. The wheel and presser apparatus are designed to enable testing of a component's side- and/or end-located terminals. A unique test probe is also taught and may similarly be used in a machine designed for testing electronic components. The probe includes a plurality of leads secured at one end to a movable, resiliently-secured base. The leads extend through a stationary guide block that accurately guides the ends of the leads toward the side-located terminals of the component to be tested and/or toward portions of the wheel and presser apparatus.

BACKGROUND OF THE INVENTION

As electronic devices have become more common, the number of small electronic components that require testing has increased dramatically. In response to this need, automated equipment capable of testing large quantities of electronic components at exceedingly high speeds has become commonplace. For example, there is equipment of this type capable of processing 50,000 electronic components per hour.

In the testing of electronic components, certain problems are commonly experienced and are often exacerbated by decreases in the size of the component to be tested. These problems have placed significant limits on the maximum component processing rate achievable by prior art testing devices.

One problem is with the testing apparatus' internal transport mechanism. Most high-volume testing machines move the components to be tested from a feed or loading station to a testing station and then to a sorting station. The transport mechanism must not only be capable of moving the components in a highly precise and controlled manner, but must also be durable, relatively low in cost and enable the testing apparatus to achieve electrical contact with a component's side- and/or end-located terminals. This combination of attributes, in an optimum form, is not found in the prior art.

A second problem is that many components feature closely-spaced side-located terminals that need to be contacted simultaneously. This requires the test probe to have closely spaced leads that are aligned with the component's sidelocated terminals. The probe's leads must be also be capable of rapid and accurate movement. Furthermore, the pressure applied by each lead to a terminal of a component being tested must be precisely controlled since the pressure must be sufficient to obtain good contact while not being of a magnitude that will cause scratching or other damage to the terminal or to the lead. The necessary accurate positioning and control of the probe's leads have been extremely difficult, if not impossible, to achieve in the prior art, and have severely limited the throughput in prior art devices.

SUMMARY OF THE INVENTION

The invention is a unique transport wheel and a unique test probe that are preferably used in a testing apparatus to transport and test small electronic components such as Integrated Passive Components (IPC's). Examples of IPC's are chips that feature capacitor, inductor or varistor arrays. Electronic components of these types typically range in size from 1 mm to 3 mm in length by 0.5 mm to 1.5 mm in width or thickness and feature end- and/or side-located terminals.

The transport wheel features a large number of peripherally-located slot-like component receiving compartments (or recesses) whereby each compartment is sized to receive a single one of the electronic components that need to be transported. In the preferred manner of use, a machine employing the transport wheel uses the wheel to carry each component from a loading station, to a testing station, and then to a sorting area. In the sorting area, the components are sorted in accordance with the results determined in the testing station.

At the bottom of each compartment in the transport wheel is a metallic insert upon which one end of the component rests during transport. The insert not only increases the durability of the wheel by providing a metal contact surface, but when the wheel is transporting electronic components that have end-located terminals, the insert makes an electrical contact with a bottom-located terminal of the component. The exposed outer ends of the insert then provide side-located metal areas on the wheel which can be contacted by a side-located test probe in the test station to thereby electrically connect a component's bottom-located terminal to a test instrument.

In the preferred embodiment, the transport wheel is used in a machine that has a specially-designed test station. The test station includes a metal contact roller that rolls along the perimeter of the wheel, and whenever the roller passes over one of the compartments, the roller will press down on the top or outer end of any electronic component that is located within the compartment. When the roller presses down on the component, it improves the contact between the component's bottom-located terminal and the metal insert of the wheel. Additionally, the metal roller will contact the component's top-located terminal, and thereby enable electrical contact with said terminal via the body of the metal roller.

The probe assembly of the invention includes multiple test leads that are precisely positioned and controlled. When used in a testing machine employing a transport wheel, the probe will preferably feature identical right and left side portions with the leads of each portion located on each side of the transport wheel. The probe is mounted on a support structure and each set of leads is secured to a resiliently-supported movable base. A force applying device, preferably controlled by a computer, is used to apply pressure to the base to cause a controlled movement of the associated leads. Each set of leads extends through a stationary guide block that accurately guides the leads toward the terminals of the component to be tested. When used with the transport wheel and metal contact roller described above, the probe can include additional leads that are guided to make contact with one or both sides of the wheel's metal insert and one or both sides of the contact roller. In this manner, the probe can make electrical contact with both of the component's end-located terminals. The probe assembly is compact, low in weight, requires little maintenance, is self-adjusting by virtue of the computer control of the force applying device's movement, and is not excessively costly to fabricate.

Furthermore, the probe's design enables the leads to move rapidly and to be extremely closely spaced.

DETAILED DESCRIPTION OF THE DRAWINGS

Figure 1:
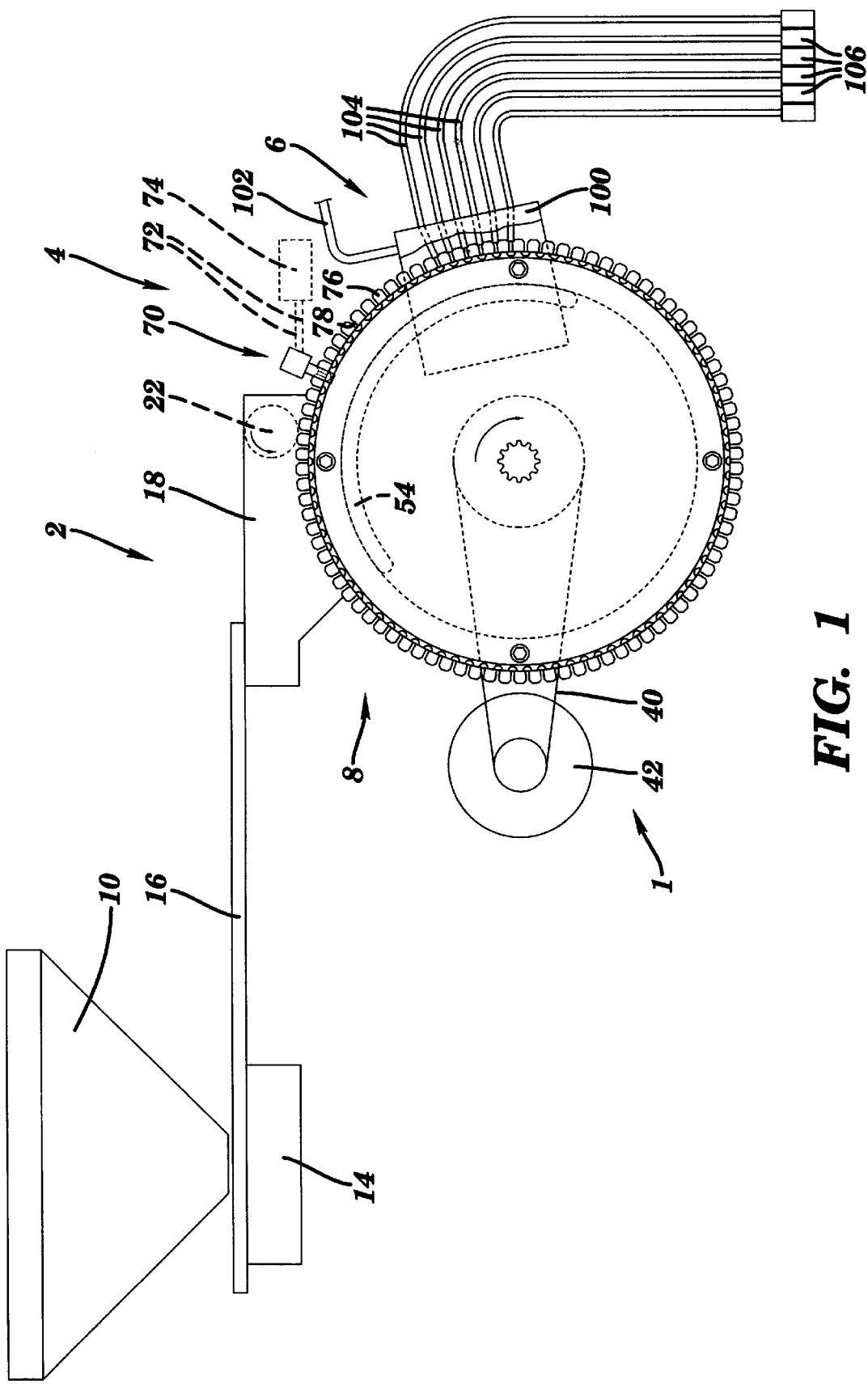
FIG. 1 is a front view of an electronic component testing and sorting apparatus that has a transport wheel and test probe in accordance with the invention.

Referring now to the drawings in greater detail, wherein like reference characters refer to like parts throughout the several figures, there is shown by the numeral 1 an apparatus for testing and sorting small electronic components.

FIG. 1 provides a front view of the apparatus 1. The apparatus includes a feed station 2, a test station 4, a sorting station 6 and a transport wheel 8. In practice, each of the stations and the transport wheel are all combined in a single cabinet-type unit (cabinet not shown).

The feed station 2 includes a funnel-like hopper 10 into which small electronic components (also herein referred to as "parts") 12, are poured in bulk quantities. The small electronic components will typically be Integrated Passive Components (IPC's) such as chip capacitors, varistors and inductors. The hopper empties into a transfer apparatus 14 that includes a vibrating unit (not shown) that facilitates separation of the parts and their movement along ramp 16.

Figure 2:
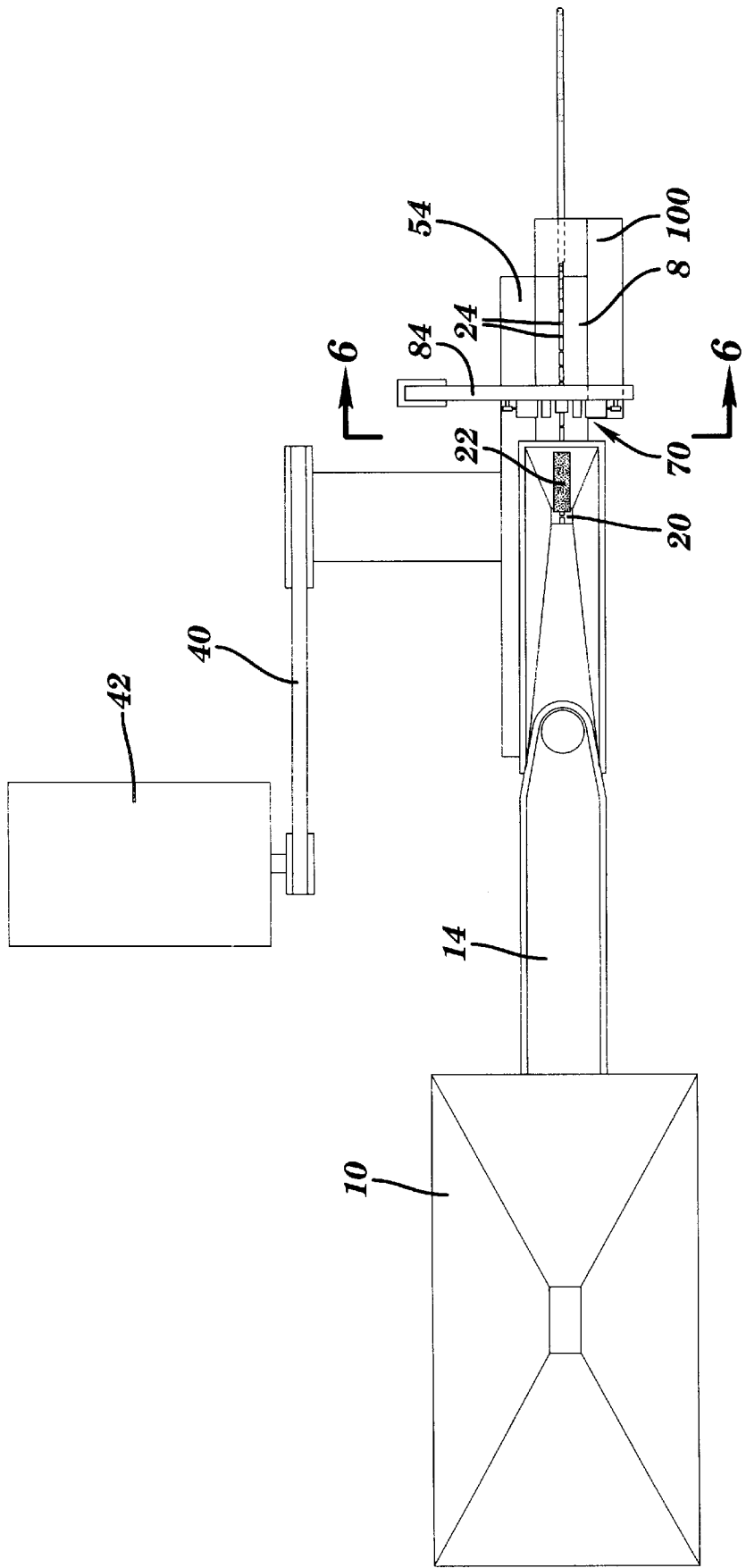
FIG. 2 is a top view of the apparatus shown in FIG. 1.

The ramp empties into a dispenser 18 that is designed to hold a relatively small number of the parts 12. Once in the dispenser, the parts may exit it through an outlet formed by an opening 20 (note FIG. 2) in its bottom portion. The dispenser includes a sweeper wheel 22 that functions to prevent the parts from escaping from the end of the dispenser and also helps to maintain the parts toward the left side portion of the dispenser. As each part 12 leaves the dispenser 18, it is directly received within a complementary-sized two-sided compartment 24 located on the outer rim of the transport wheel 8. A depiction of a part loaded into the rim of the transport wheel is provided in FIG. 3. It should be noted that the part includes side-located terminals 26 and end-located terminals 28.

Figure 4:
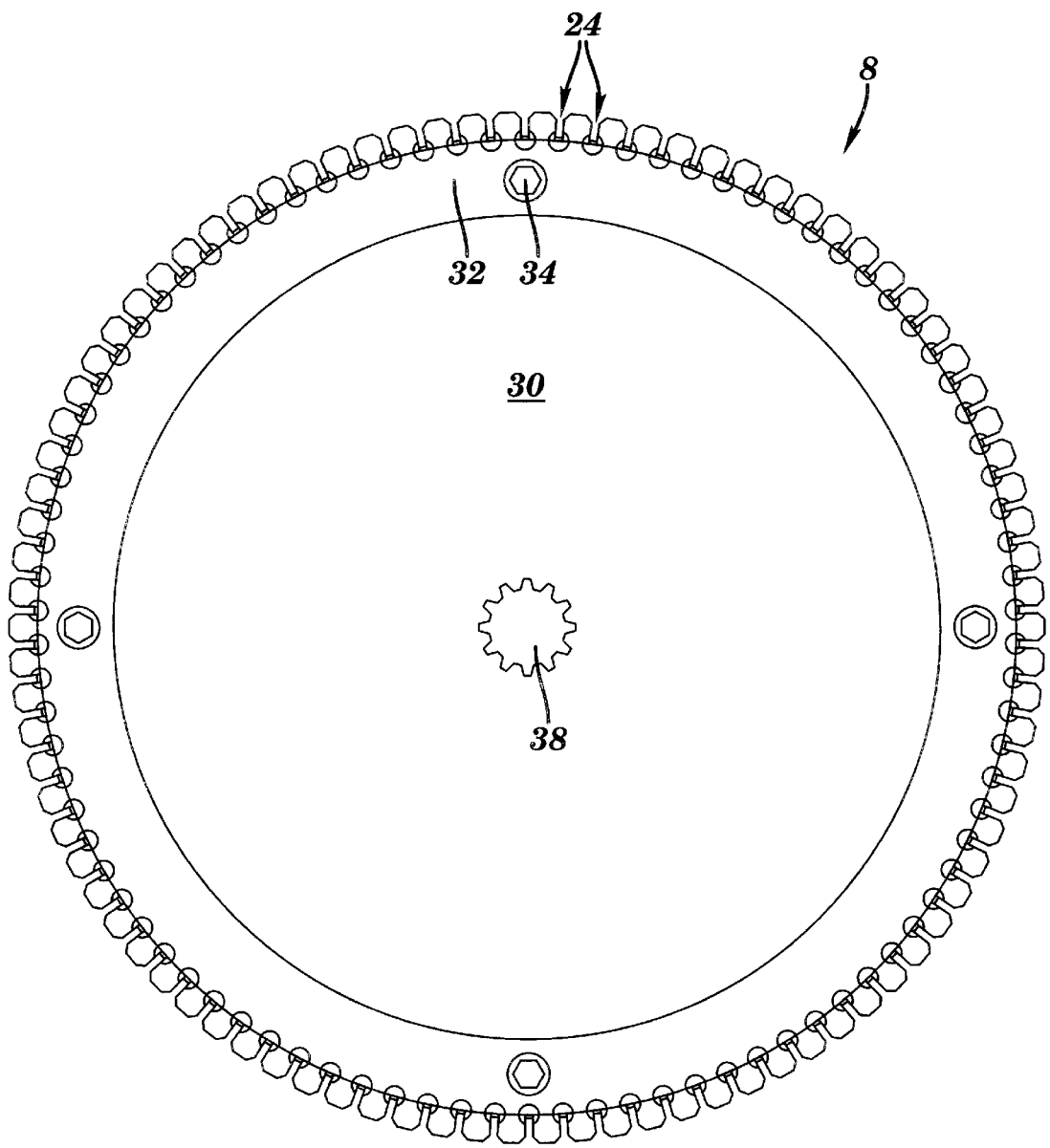
FIG. 4 is a rear view of the transport wheel.
Figure 9:
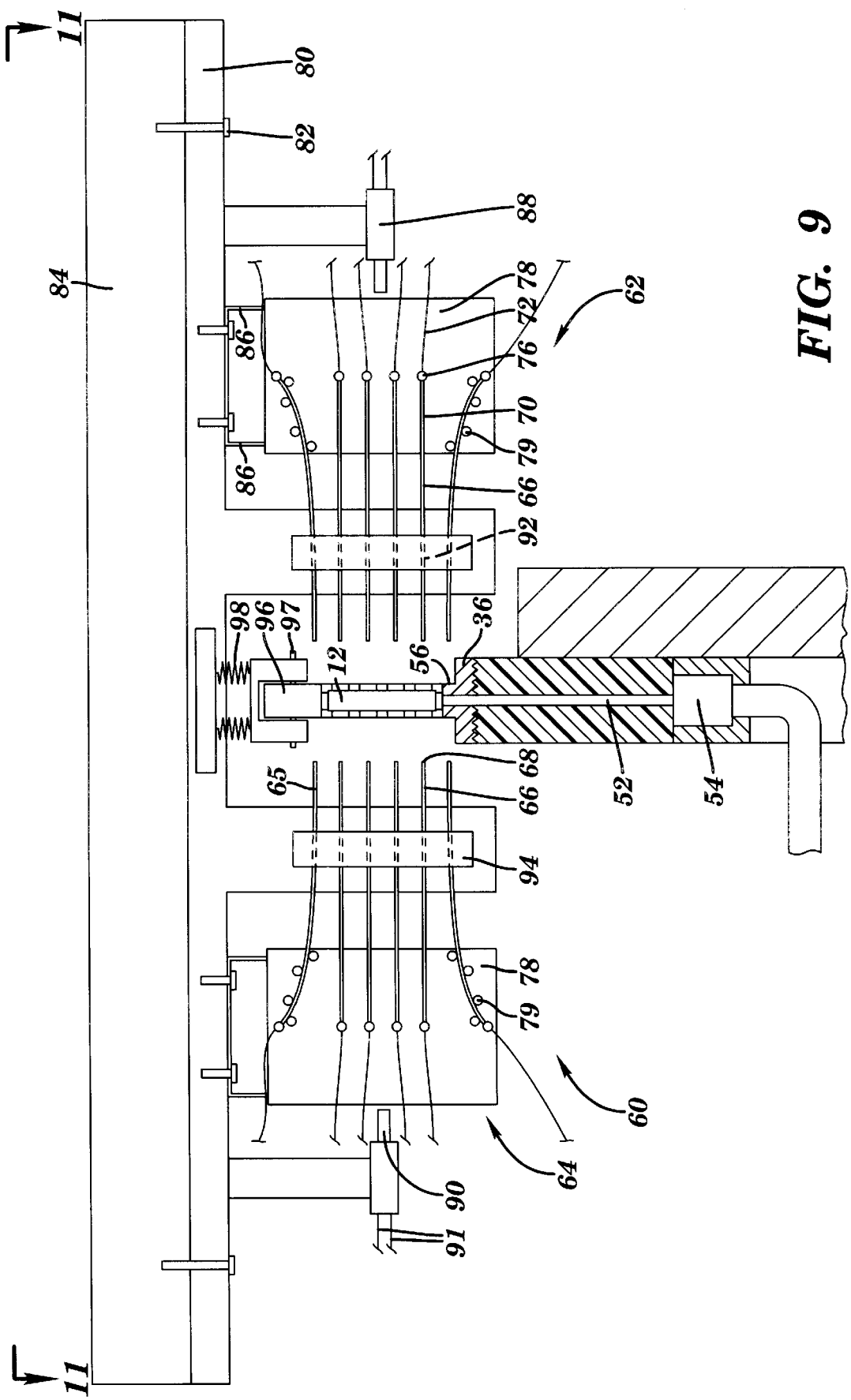
FIG. 9 provides a side, detailed view of a test probe in accordance with the invention. The probe is shown in a position wherein the probe's leads have not yet been extended to contact an electronic component for testing.

FIG. 4 provides a rear view of the transport wheel 8. The wheel includes a metal hub 30 and a circular portion in the form of a rim member 32. The rim member is preferably approximately twelve to eighteen inches in diameter and is removable from the metal hub through the use of conventional fasteners, such as screws or bolts 34.

The rim member 32 is preferably made of a rigid and non-conductive plastic material. All of the compartments 24 are located in the rim member and create peripheral openings in the outer edge of the member. As will be described shortly, the base of each compartment includes a metallic insert 36. By having the rim member 32 removable from the hub 30, a user can remove one rim member and replace it with another rim member that has differently dimensioned compartments 24 to fit a different size of electronic component. The hub 30 has a pulley 38 fixed to its rear surface and connected by belt 40 (shown in FIG. 1) to an electric motor 42. The electric motor is responsible for causing rotation of the wheel.

FIGS. 5–8 provide detailed views showing how the rim member 32 is fabricated.

Figure 5:
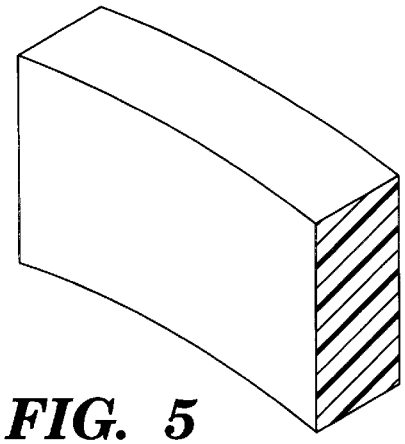
FIG. 5 shows a first stage in the manufacture of the rim portion of the transport wheel.

FIG. 5 shows a portion of the rim member when the member is at an early stage in its fabrication. At this point, the rim member is in the form of a simple ring. If one were to take a cross-section through the portion shown in FIG. 5, one would see that the portion has a rectangular cross-section that preferably has dimensions of approximately 6 mm wide by approximately 15 mm high.

Figure 6:
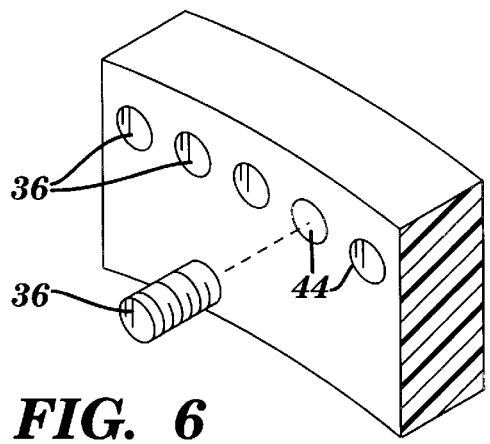
FIG. 6 shows a second stage in the manufacture of the rim portion of the transport wheel.

FIG. 6 shows the same portion of the rim member as shown in FIG. 5. However, a plurality of holes 44 have been drilled in the member and a metal insert 36, in the form of a setscrew, has been threaded into each hole.

Figure 7:
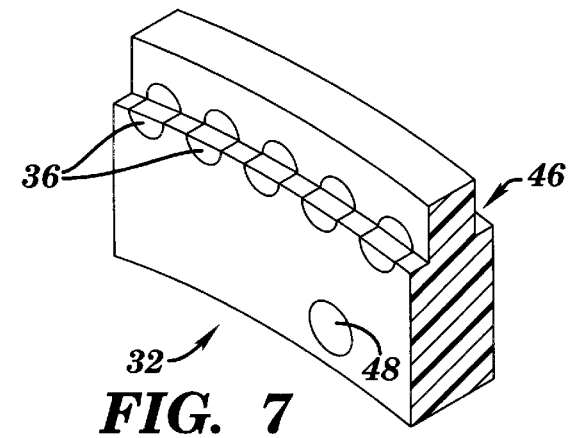
FIG. 7 shows a third stage in the manufacture of the rim portion of the transport wheel.

FIG. 7 shows the same portion of the rim member as shown in FIGS. 5 and 6. However, the top portion 46 of the rim member has been machined to have a thickness of slightly less than 2.5 mm. The machined top portion extends approximately 6 mm from the top of the rim member to a point at or near the center of the metal inserts/setscrews 36. A plurality of holes 48 may also be drilled into the rim member at this time to enable connection of the rim member to the hub 32 with fasteners 34.

Figure 8:
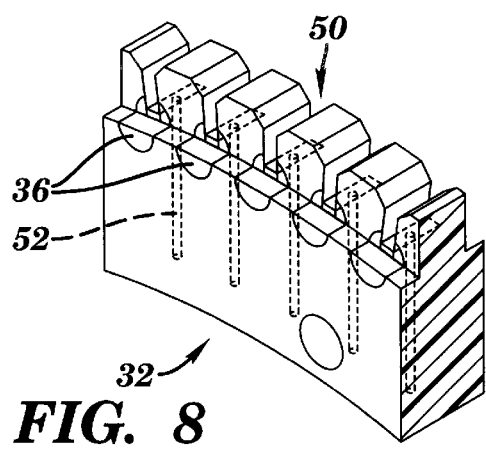
FIG. 8 shows a final stage in the manufacture of a rim portion of the transport wheel.

FIG. 8 shows the same portion of the rim member as shown in the previous three figures. In the last step of machining, a plurality of cuts 50 are made in the top portion 46 of the rim member. These cuts are centered on, and extend partially through, the setscrews and form the compartments 24. The width of each cut is slightly greater than the width or thickness of an electronic component that will be received in the resultant compartment 24. Once the cuts have been made, a narrow thru-bore or tunnel 52 is drilled into the center of the metal insert and continued downward until it extends entirely through the rim member. The thru-bore 52 enables a vacuum to be applied to the bottom of each compartment 24 from a conventional vacuum apparatus (not shown) via an adaptor 54 shown in FIGS. 1, 2, 9 and 10. The application of vacuum to the compartment 24 serves the purpose of helping to maintain a part 12 in the compartment as the wheel rotates.

It should also be noted in FIG. 8 that side portions 56 of the metal insert/setscrew are located on the sides of the rim member and are exposed just below the associated compartment 24. As a result, the side portions 56 are readily accessible from the sides of the wheel.

Figure 3:
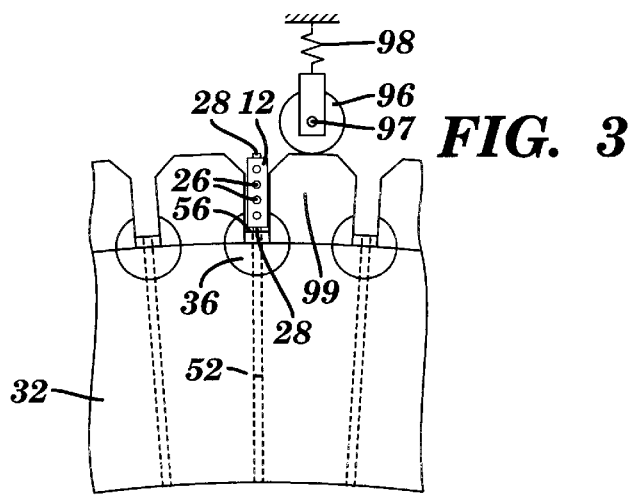
FIG. 3 is a front view of an electronic component located in one of the compartments of the transport wheel at a point just prior to entering the test station.

As noted previously, FIG. 3 shows an electronic component 12 located in one of the compartments 24 of the wheel. FIG. 3 shows the part 12 just prior to the part entering the test station 4. It is in the test station that leads from a test probe are temporarily placed into contact, either directly or indirectly, with the terminals of the component 12. Various portions of the test station are detailed in FIGS. 9 thru 11.

The test station includes a test probe 60 having right and left side portions 62 and 64. Each portion includes a plurality of leads 66. While each of the side portions is shown having five leads, a greater or lesser number of leads may be employed in each of the side portions. It should be noted that in some cases, the probe 60 may include only one of the portions 62 or 64.

Each lead 66 is made of a conductive material, is fairly rigid and may be in the form of an inexpensive wire or pin. The outer end 68 of each lead is preferably flat and is adapted for contacting a terminal of a part to be tested. The opposite end 70 of each lead is electrically-connected to a flexible wire 72 that is itself connected to a test instrument 74, such as an oscilloscope, logic analyzer, emulator or other well known testing or diagnostic apparatus. A clamp 76, or other conventional fastener or fastening method, is employed to fix end portion 70 of each lead to a movable base 78. It should be noted that the top and bottom leads 66 are shown having an arcuate shape on the base while the other leads are shown straight. The bending of the rear portion of the top and bottom leads increases the space available for anchoring the leads, while at the same time enabling a close spacing of the leads as they extend outwardly from the base. The curved portion of each of the top and bottom leads is positionally restrained by posts 79 that extend upwardly from the surface of the base 78. Depending on the space availability, the probe can be manufactured with all of the leads being straight or, if space availability is severely limited, more of the leads could have arcuately-shaped rear portions in the same manner as the top and bottom leads shown and be positionally-secured with additional posts 79.

Each of the bases 78 are movably secured to a relatively non-movable support body in the form of base plate 80. The plate is secured by fasteners 82 to a fixed structure such as the stationary framework 84 of the machine. The structure used to movably attach each base to plate 80 enables a resilient movement of the base. In the preferred embodiment, the attachment structure is in the form of two thin, metal leaf springs 86. While two leaf springs are shown, a single spring or a number of springs greater than two may alternatively be employed. It should also be noted that while the use of leaf springs is shown, other equivalent resilient structures, such as other types of springs, including coil springs, or even a resilient material such as rubber, may alternatively be employed. Furthermore, a damping apparatus (not shown) such as a hydraulic cylinder or soft cushion member may be employed adjacent the rest position of one or both bases to dampen any unwanted oscillation of the base(s).

Located adjacent each base 78 and non-movably secured to the base plate 80 is a force applying device 88. The device 88 is shown having a piston 90 that is capable of applying pressure to the side of the movable base 78 and thereby causing said base to move toward the wheel 8. Actuation of the device 88 is via wires 91 and is preferably caused by the testing instrument 74 or by a computer (not shown) that may be included with the testing device or be separate therefrom. In the preferred embodiment, the device 88 is electrically-powered and may be in the form of a solenoid, linear actuator or other device, or combination of devices or elements, capable of applying a force to the movable base 78. As an alternate embodiment that is not shown, the force applying device can be mechanically operated and moved in step with the movement of the wheel 8. Also in the preferred embodiment, the distance the piston 90 moves is also controlled by the testing instrument/computer. This enables the probe to be automatically adjusted whereby the testing instrument/computer can change the distance the leads move via the force applying device 88 to compensate for changes due to wear of the leads or differently dimensioned parts 12.

From the base 78, each lead 66 extends through a thru-bore or tunnel 92 in a guide block 94. The guide block includes a plurality of the thru-bores 92, with an intermediate portion of each lead located within one of the thru-bores. In the preferred embodiment, the length of each thru-bore is two or more times greater than its diameter. This enhances the directional guidance given each lead by the thru-bores.

Each guide block 94 is fixedly secured to the base plate 80 of the probe and spaced from the nearby base 78. Since the guide blocks are fixed, they do not move when the bases 78 move. It should be noted that while all of the leads are shown extending through the guide block, this is not required. In an alternative embodiment that is not shown, some of the leads can bypass the guide block.

Located in line with the perimeter of the rim member 32 is a presser apparatus that includes a contact roller 96. The roller is made of an electrically-conductive metal material and is rotatable on an axle 97 that is secured to base plate 80 (or alternatively to the framework of the machine) via spring supports 98. The spring supports are preferably conventional in design and may resemble the pogo pins used in prior art testing devices. The supports 98 are variable in length and include springs that continually bias or urge the supports to their maximum length. As the wheel rotates, the spring supports continually urge the roller toward the rim member 32 whereby the roller rolls on, and at the same time, presses on the perimeter of the rim member. FIG. 3 shows the roller contacting the end of one of the rim member's tooth-shaped portions 99. As the wheel continues rotating from the position shown in FIG. 3, the roller rolls off the tooth-shaped portion 99 of the rim member and onto the outer end of the component 12. Once the roller is fully pressing onto the component 12, the part is ready for testing and is in the position shown in FIG. 9. The downward force exerted by the roller on the component 12 pushed the component tightly against the surface of the metal insert 36 and thereby ensures good contact between the component's bottom-located terminal 28 and the metal insert. In addition, the roller pressing down on the top of the component 12 creates a good contact between the top-located terminal 28 of the component and the surface of the roller. This enables leads 66 from the probe to make electrical contact with the top-located terminal 28 of the component by pressing against one or both sides of the roller. In the figures, the leads are shown making contact with both sides of the roller.

Figure 10:
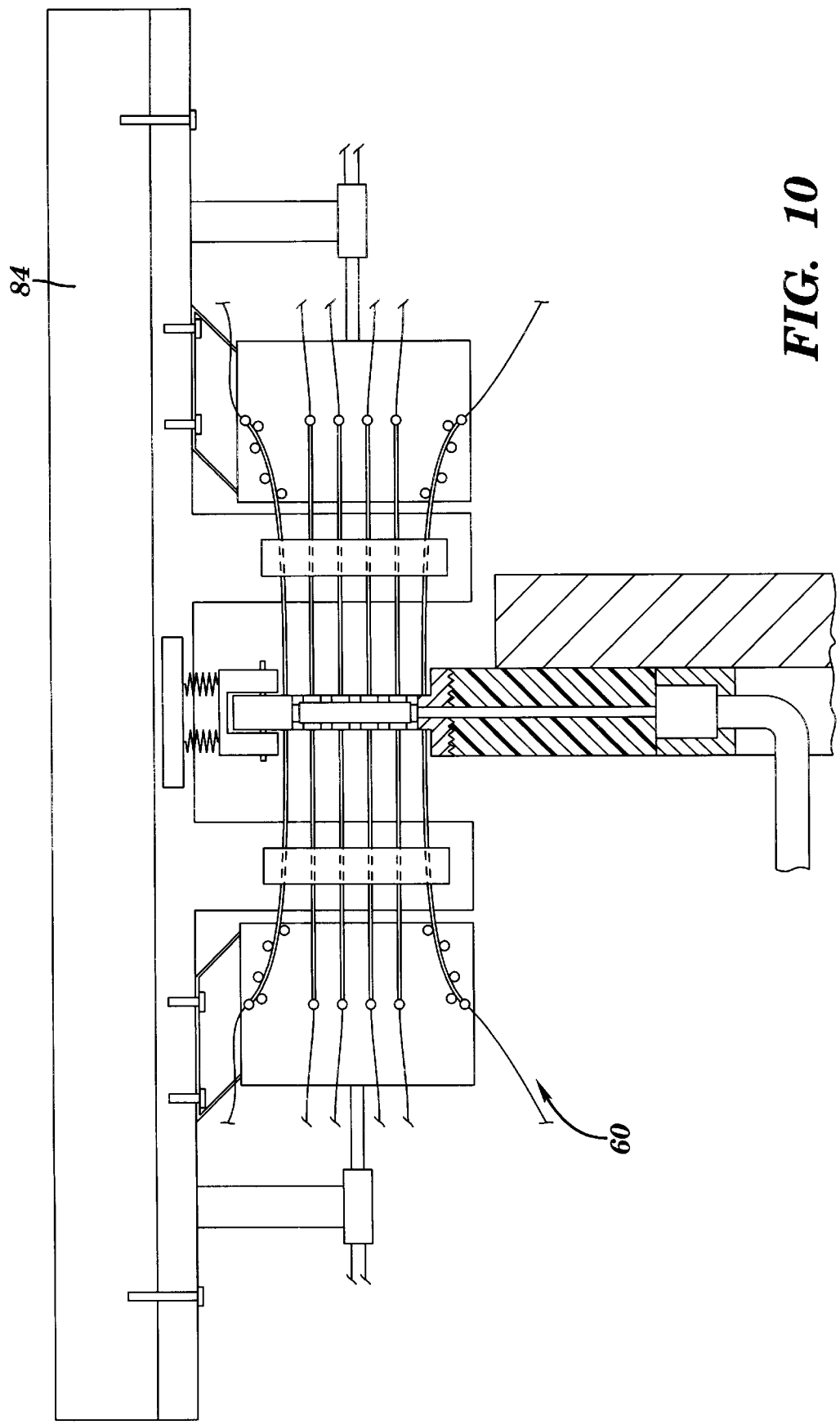
FIG. 10 shows the probe of FIG. 9 at a point where the probe's leads have been extended to contact an electronic component for testing.
Figure 11:
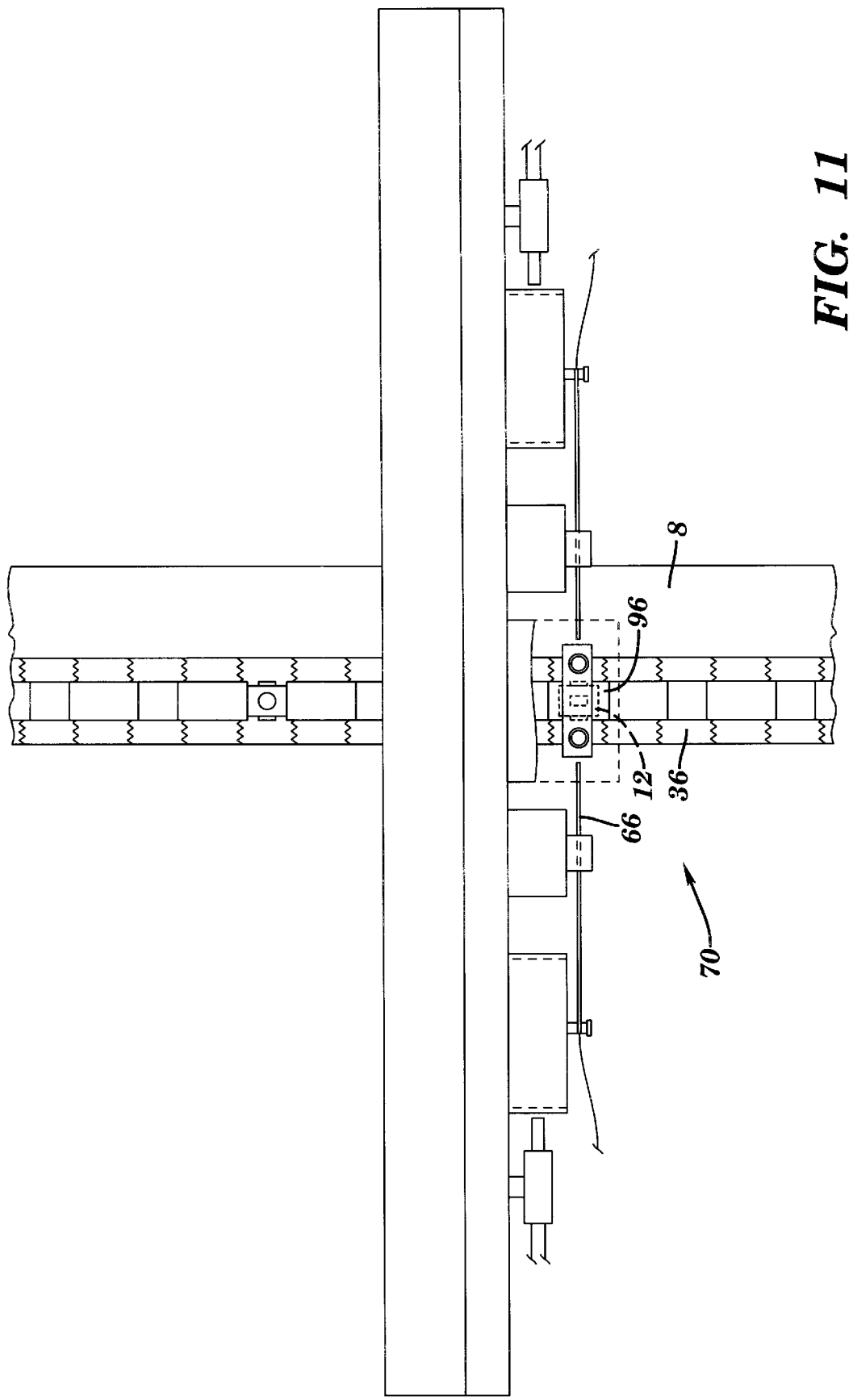
FIG. 11 is a plan view of the probe shown in FIG. 9.

In operation, when a part 12 is brought into the test station for testing and is properly positioned between the right- and left-side portions of the probe, an electrical signal is sent by the controlling computer to both of the force applying devices 88. Each device 88 will then apply pressure to the side of the adjacent movable base 78 and cause the base to move toward the wheel 8. In the preferred embodiment, the bases would only move a short distance, such as 1 mm (distances are shown exaggerated in the figures). As the bases move toward the part to be tested, the leads attached to the bases move through the thru-bores in the guide blocks and are thereby accurately aimed so that their ends 68 precisely contact the side terminals of the part to be tested, as well as toward the exposed outer side portions 56 of the metallic insert 36 located at the base of each compartment 24 and the sides of the metal roller 96. FIG. 10 shows the point where the force applying devices 88 have caused a predetermined amount of movement of the bases 78 and the ends 68 of the leads contact the terminals of the part, as well as the side portions 56 of the metallic insert and the sides of the metal roller 96. Testing of the part can then commence.

Once the testing of the part 12 has been completed, the pistons 90 of the force applying devices 88 retract. The leaf springs 86 then cause the bases 78, and the leads attached to the bases, to return to their initial position shown in FIG. 9. The wheel 8 will then rotate and cause the roller 96 to roll off the end of the part 12. Rotation of the wheel will continue until the next part 12 is brought into the test station. Eventually, rotation of the wheel will bring the tested part into the sorting station 6.

The sorting station 6 is conventional in design and includes a block 100 that houses a series of electrically-operated solenoid valves (not shown). Each valve is connected to a source of pressurized air via hose 102, and when opened, can direct pressurized air toward one of the compartments 24. Aligned with the compartments and the valves are a plurality of tubes 104, with each tube being specific to the position of one of the compartments 24 and extending to its own dedicated part-receiving bin 106.

After a part 12 has been tested at the test station, its test results are temporarily stored by the testing instrument. The testing instrument is connected to the solenoid valves so that, based on the test results determined at the test station, when a part 12 reaches an appropriate position, it will be aligned with a particular one of the valves. The valve is caused to open by the test instrument and pressurized air is then directed from the valve into the compartment 24 that is adjacent to the valve. This forces the part 12 to be pushed into the adjacent tube 104 and then into the appropriate receiving bin 106.

While the probe 60 has been taught as being used within the test station of the testing and sorting machine described herein, it should be noted that the probe may be employed in any other type of machine or environment in which an electrical probe is employed. Similarly, the taught transport wheel 8 and/or metal contact roller may be employed in electronic part testing devices other than the one shown, and used with other types of test probes than the one shown.

The embodiments disclosed herein have been discussed for the purpose of familiarizing the reader with the novel aspects of the invention. Although preferred embodiments of the invention have been shown and described, many changes, modifications and substitutions may be made by one having ordinary skill in the art without necessarily departing from the spirit and scope of the invention as described in the following claims.

We claim:

1. A probe designed to be used in the testing of electronic components, wherein said probe can be operatively connected to a testing instrument, said probe comprising:
    a stationary framework;
    a base movably secured to said stationary framework;
    a plurality of electrically-conductive elongated leads secured to said base and operatively connected to a testing instrument, and wherein at least one of said leads has an end portion adapted for contacting a terminal of an electronic component to be tested;
    a guide block secured to said stationary framework and having at least one thru-bore, wherein at least one of said leads extends through and is movable within said at least one thru-bore; and,
    an electro-mechanically driven piston arranged for driving said base, at high speed between one of two positions, wherein when an electronic component is located at a predetermined position relative to said guide block, an actuator will cause said electro-mechanical piston to move said base and thereby cause the leads secured to said base to move toward said component, and said at least one thru-bore will guide an associated one of said leads toward a terminal of said electronic component.

2. The probe of claim 1 wherein said base is secured to said stationary framework by a resilient structure.

3. The probe of claim 2 wherein said resilient structure is in the form of at least one leaf spring.

4. The probe of claim 1 wherein the guide block has a plurality of said thru-bores, wherein each of said leads extends through a different one of said thru-bores.

5. The probe of claim 1 wherein electro-mechanically driven piston is in the form of an electrically-actuated solenoid.

6. The probe of claim 1 wherein the actuator is in the form of a computer.

7. The probe of claim 1 further comprising:
    a second base movably secured to said stationary framework;
    a plurality of electrically-conductive elongated leads secured to said second base and operatively connected to a testing instrument, and wherein at least one of said leads has an end portion adapted for contacting a terminal of an electronic component to be tested;
    a second guide block secured to said stationary framework and having at least one thru-bore, wherein at least one of said leads secured to said second base extends through and is movable within said at least one thru-bore; and,
    an electro-mechanically driven piston that, when an electronic component is located at a predetermined position relative to said second guide block, will be actuated by an actuator and cause movement of said second base so that the leads secured to said second base move toward said electronic component.

8. A transport wheel adapted for use in a device for testing electronic components, wherein said transport wheel functions to carry said electronic components from a feed station where said components are loaded into the transport wheel, and then to a test station where said components are tested, said wheel comprising;
    a circular portion made of a non-conductive material, wherein said circular portion includes a plurality of compartments that are each sized to receive an electronic component for testing; and
    a plurality of metal members, wherein each metal member forms a base portion of each compartment and is capable of contacting an end-located terminal of an electronic component when said component is located in a compartment atop said metal member, wherein each of said metal members includes at least one side portion that is accessible from a point exterior to a first side of the circular portion.

9. The transport wheel of claim 8 wherein the metal member is secured to the circular portion by a plurality of threads located in a center portion of said member.

10. The transport wheel of claim 8 wherein each of said compartments is capable of being connected to a source of vacuum via a thru-bore that extends through the metal member associated with the compartment and continues through the non-conductive material of the circular portion.

11. A method for fabricating a transport wheel adapted for use in a device for testing electronic components, wherein said transport wheel functions to carry said electronic components from a feed station where said components are loaded into the transport wheel, to a test station where said components are tested, said method comprising;
    fabricating a circular member from a non-conductive material;
    making a plurality of thru-holes in said circular member, wherein said thru-holes are evenly spaced about said circular member;

placing each of a plurality of metal members into each of a plurality of said thru-holes;

machining a perimeter portion of said circular member to reduce a thickness dimension of said perimeter portion; and making a plurality of evenly spaced-apart slots in said perimeter portion, wherein said slots are located whereby one of said metal members forms a base portion of each slot.

12. The method of claim 11 wherein the metal member is positioned so that it is accessible from at least one side of the circular member.

13. The method of claim 11 wherein each of the metal members has exterior threads and wherein insertion of each metal member into the circular member is achieved by rotating the metal member so that its threads engage an interior surface of the associated thru-hole in the circular member.

14. The method of claim 11 wherein after making said slots, a thru-bore is drilled through each of said metal members and continued through the non-conductive material of the circular member.

15. A device for testing electronic components, said device comprising:

a feed station adapted to receive bulk quantities of electronic components and then to dispense said components through an outlet;

a transport wheel, said transport wheel having a plurality of separate, spaced-apart, peripherally-located compartments adapted to receive electronic components from the outlet of the feed station, wherein each compartment is open on two opposite sides and wherein a base portion of each compartment includes a metal area capable of contacting an end-located terminal of an electronic component when said component is located in said compartment, wherein the metal area includes a portion exposed on at least one side of said wheel;

a test station that includes a probe having a plurality of movable leads, wherein said leads are capable of contacting a plurality of side-located terminals of an electronic component when said component is located in a compartment of said transport wheel proximate said probe;

testing apparatus operatively connected to said probe of the test station; and wherein when an electronic component is located in one of the compartments of the transport wheel, it can be transported from the feed station to the test station.

16. The device of claim 15, wherein said probe includes:

a support body;

a base movably secured to said support body;

said plurality of movable leads, wherein each lead is elongated, made of an electrically-conductive material, and is secured to said base and operatively connected to said testing apparatus, and wherein at least one of said leads has an end portion adapted for contacting a terminal of an electronic component to be tested;

a guide block secured to said support body and having a plurality of thru-bores through which a plurality of said leads extend and are movable within; and a force applying device capable of causing movement of said base when an electronic component is located at a predetermined position relative to said guide block, wherein movement of said base causes a corresponding movement of the leads secured to said base, and wherein a plurality of said leads are guided in their movement by the thru-bores in the guide block.

17. The device of claim 16 wherein a resilient structure connects the probe's base to the support body of said probe.

18. The device of claim 15 further comprising a presser apparatus, wherein when an electronic component is located in the test station with a bottom end of said component located on top of the metal area of the compartment, the presser apparatus functions to press down on a top end of the component.

19. The device of claim 18 wherein the presser apparatus includes a roller that rolls along a peripheral portion of the transport wheel, and wherein said roller is secured to the device by at least one spring support member that positionally biases the roller toward the peripheral portion of the transport wheel.

20. The device of claim 19 wherein the roller is made of an electrically-conductive metal material.

21. The device of claim 20 wherein the probe includes leads that are positioned whereby when an electronic component is in the test station and positioned for testing, at least one lead from said probe will contact the metal area of the compartment in which the component is located, and at least one other of the probe's leads will contact a side of the roller.

22. The device of claim 21 wherein said probe includes:

a support body;

a base movably secured to said support body;

said plurality of movable leads, wherein each lead is elongated, made of an electrically-conductive material, and is secured to said base and operatively connected to said testing apparatus, and wherein at least one of said leads has an end portion adapted for contacting a terminal of an electronic component to be tested;

a guide block secured to said support body and having a plurality of thru-bores through which a plurality of said leads extend and are movable within; and a force applying device capable of causing movement of said base when an electronic component is located at a predetermined position relative to said guide block, wherein movement of said base causes a corresponding movement of the leads secured to said base, and wherein a plurality of said leads are guided in their movement by the thru-bores in the guide block.

* * * * *